United States Patent [19]

Ogihara

[11] Patent Number: 4,829,483

[45] Date of Patent: May 9, 1989

[54] METHOD AND APPARATUS FOR SELECTING DISCONNECTING FIRST AND SECOND BIT LINE PAIRS FOR SENSING DATA OUTPUT FROM A DRAM AT A HIGH SPEED

[75] Inventor: Masaki Ogihara, Yokohama, Japan

[73] Assignee: Kabushiki Kaisha Toshiba, Kawasaki, Japan

[21] Appl. No.: 128,779

[22] Filed: Dec. 4, 1987

[30] Foreign Application Priority Data

Dec. 9, 1986 [JP] Japan .................. 61-292764

[51] Int. Cl.$^4$ .............................. G11C 7/00
[52] U.S. Cl. .................. 365/190; 365/202; 365/203; 365/205
[58] Field of Search .............. 365/190, 189, 203, 202, 365/205, 233, 149

[56] References Cited

U.S. PATENT DOCUMENTS

4,740,926  4/1988  Takemae et al. .................... 365/189

Primary Examiner—Terrell W. Fears
Assistant Examiner—Alfonso Garcia
Attorney, Agent, or Firm—Finnegan, Henderson, Farabow, Garrett & Dunner

[57] ABSTRACT

A dynamic semiconductor memory apparatus which can sense data at high speed includes first and second bit line pairs, memory cells connected to the first bit line pair, barrier transistors connected between the first and second bit line pairs, and a control unit for outputting a first control signal to the barrier transistors and for controlling transmission of a potential difference generated in the first bit line pair due to data read out from the memory cells to the second bit line pair in accordance with an input read control signal. The first control signal is at a first level for a first predetermined time interval after the read control signal is input, at a second level for a second predetermined time interval after the first predetermined time interval has passed, and at the first level after the second predetermined time interval has passed. An impedance of the barrier transistors obtained when the first control signal is at the first level is smaller than that obtained when the control signal is at the second level.

17 Claims, 5 Drawing Sheets

METHOD AND APPARATUS FOR SELECTING DISCONNECTING FIRST AND SECOND BIT LINE PAIRS FOR SENSING DATA OUTPUT FROM A DRAM AT A HIGH SPEED

Background of the Invention

The present invention relates to a dynamic semiconductor memory apparatus and, more particularly, to a method of, sensing data at high speed by controlling the operation of barrier transistors and reducing peak current values, during a sensing/restoring operation in a memory apparatus having barrier transistors between bit lines and a sense amplifier, and to a dynamic semiconductor memory apparatus for realizing the method.

Figure 1:
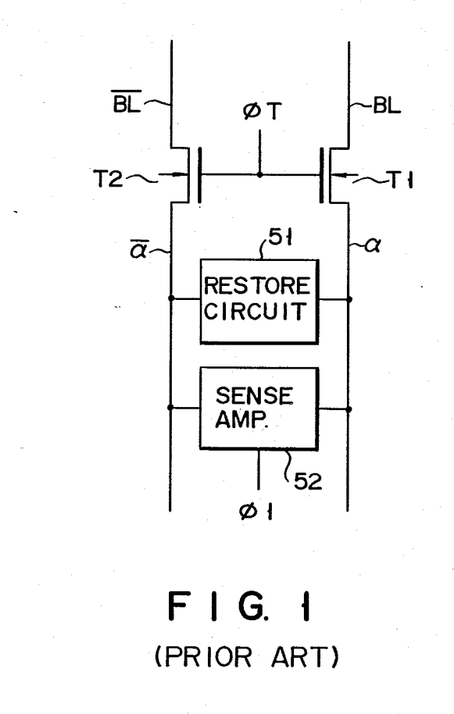
FIG. 1 is a circuit diagram showing part of an arrangement of a conventional dynamic random access memory (DRAM)

As shown in FIG. 1, in a dynamic random access memory (DRAM), n-channel MOS transistors T1 and T2 are inserted in series with ends of a first bit line pair BL and $\overline{BL}$, respectively, of each column to be connected to memory cells (not shown). Restore circuit 51 and synctype sense amplifier 52 for receiving sync signal $\phi 1$ to perform a sense-amplifying/latching operation, are connected between a second bit line pair $\alpha$ and $\overline{\alpha}$ at the side opposite to that of the memory cells, with reference to barrier transistors T1 and T2. Note that a precharge equalizer (not shown) is connected to the other ends of bit lines BL and $\overline{BL}$.

Figure 2:
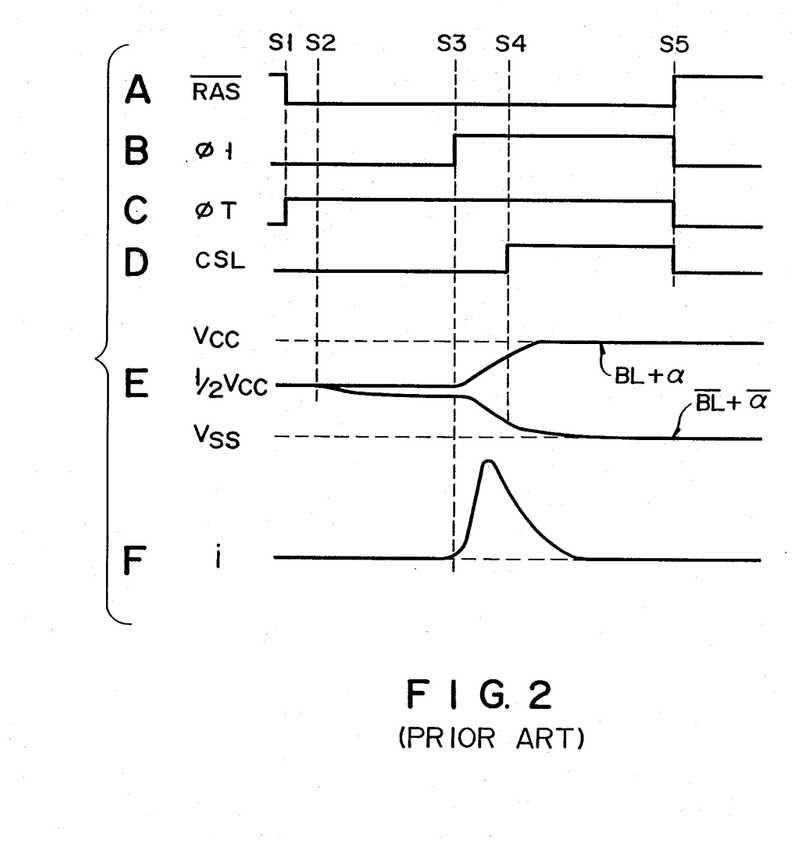
FIGS. 2A to 2F are timing charts for explaining a sensing operation of the conventional DRAM of FIG. 1.

As shown in FIG. 2A, memory cell data is read out when read control signal $\overline{RAS}$ is input to the DRAM at timing S1. That is, as shown in FIG. 2C, control signal $\phi T$ is activated to turn on barrier transistors T1 and T2. Thereafter, as shown in FIG. 2E, at timing S3, amplifier 52 amplifies a small potential difference generated between bit lines BL and $\overline{BL}$ connected to memory cells selected at timing S2 in accordance with control signal $\phi 1$ shown in FIG. 2B. Therefore, read data "1" or "0" is determined. At this time, since a charge stored in the bit lines is discharged at once as shown in FIG. 2F, a large current flows to, which generates noise. In addition, as a DRAM is highly integrated, a load capacitance of bit lines BL and $\overline{BL}$ is increased to increase the sensing time. Therefore, resistance RV of barrier transistors T1 and T2 is inserted between bit lines BL and $\overline{BL}$ and amplifier 52 so that a potential difference between bit line portions $\alpha$ and $\overline{\alpha}$ with a small capacitance at the side of amplifier 52 can be rapidly sensed. Control signal $\phi T$ is supplied to the gate of each of barrier transistors T1 and T2, and potentials as shown in the following Table are used.

| Bit Line Precharging Voltage | Sensing Operation | Restoring Operation | Precharging Operation |
|---|---|---|---|
| Vcc (Power Source Potential) | >Vcc + VT | >Vcc + VT | >Vcc + VT |
| Vcc (Ground Potential) | Vcc | >Vcc + VT | Vcc |
| ½ Vcc | Vcc | >Vcc + VT | Vcc |

In the above Table, VT represents a threshold voltage of barrier transistors T1 and T2, and a constant potential (Vcc+VT or Vcc) is used as signal $\phi T$ during the sensing operation in any of the above cases.

As resistance RV of barrier transistors T1 and T2 is increased, a time required for transmitting the small potential difference generated between bit lines BL and $\overline{BL}$ to bit line portions $\alpha$ and $\overline{\alpha}$ through barrier transistors T1 and T2 is increased. Therefore, the start of the sensing operation is delayed. On the contrary, when resistance RV is reduced, the smaller the difference between resistance RV and resistance RS of transistors of amplifier 52 becomes, the longer the time required for completing the sensing operation with respect to the potential difference between bit line portions $\alpha$ and $\overline{\alpha}$ becomes. That is, since the relationship between the load capacitance of bit lines BL and $\overline{BL}$, resistance RV of barrier transistors T1 and T2, and resistance RS of the transistors of amplifier 52 is complex, it is difficult to design a DRAM which can perform the sensing operation at high speed as the capacity of the DRAM is increased. Moreover, when resistance RS of the transistors of amplifier 52 is reduced, i.e., a current drive capability is improved, change over time di/dt of a bit line charging/discharging current during the sensing operation is increased, thereby generating a large noise signal on the power source line of the memory chip.

SUMMARY OF THE INVENTION

The present invention has been made in consideration of the above situation, and has as its object to provide a dynamic semiconductor memory apparatus which can easily perform a sensing operation at high speed and can reduce a peak current value during a sensing/restoring operation. The dynamic semiconductor memory apparatus comprises first and second bit line pairs, barrier transistors, and a controller. Memory cells are connected to the first bit line pair. The barrier transistors are connected between the first and second bit line pairs. Impedance of the barrier transistors is varied in accordance with a level of an input first control signal. The controller outputs the first control signal to the barrier transistors and controls transmission of a potential difference generated in the first bit line pair due to data read out from the memory cell to the second bit line pair in accordance with an input read control signal. The first control signal is at a first level for a first predetermined time interval after the read control signal is input, at a second level for a second predetermined time interval after the first predetermined time interval has elapsed, and at the first level after the second predetermined time interval has elapsed. The impedance of the barrier transistors obtained when the first control signal is at the first level is lower than that obtained when the control signal is at the second level.

As described above, according to the present invention, after the potential difference generated between bit lines BL and $\overline{BL}$ is transmitted to bit line portions $\alpha$ and $\overline{\alpha}$ at the side of the sense amplifier through the barrier transistors, the barrier transistors are turned off, and the sense amplifier starts the operation. Since load capacitances of the bit line portions $\alpha$ and $\overline{\alpha}$ are small, a sensing operation is completed at high speed and a reading operation of the memory itself is performed at high speed. In addition, a restore circuit may be connected between bit lines BL and $\overline{BL}$ at a position closer to memory cells than the barrier transistors. Therefore, a restoring operation of the restore circuit with respect to bit line portions $\overline{\alpha}$ and $\alpha$ sensing operation with respect to the bit line portions at the side of the sense amplifier can be performed at different timings while the barrier transistors are turned off. As a result, the change over time of the bit line charging/discharging current can be reduced to prevent generation of noise in a memory power source potential. Moreover, by temporarily turning off the barrier transistors after a memory cell is selected, data can be transferred from the memory cells to the sense amplifier at high speed.

DETAILED DESCRIPTION OF THE PREFERRED EMBODIMENTS

Preferred embodiments of a dynamic random access memory (DRAM) according to the present invention will be described in detail with reference to the accompanying drawings.

Figure 3:
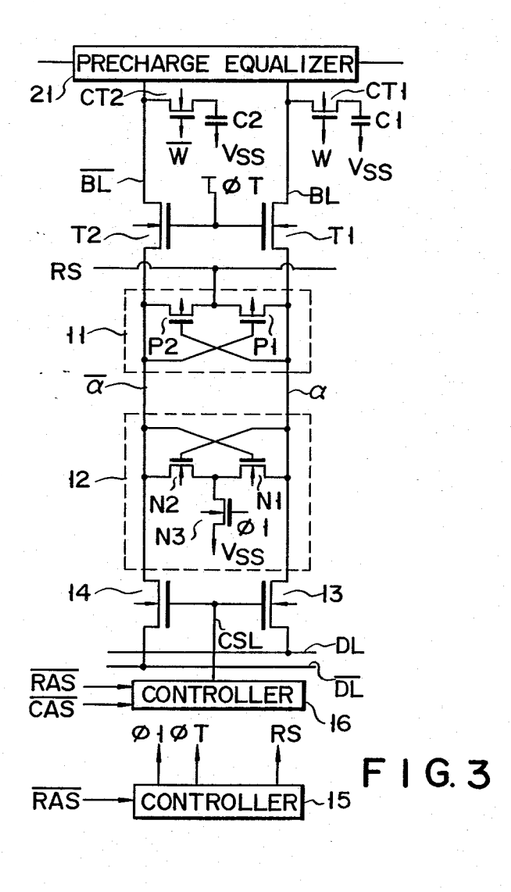
FIG. 3 is a circuit diagram showing part of an arrangement of a ½ Vcc precharging type DRAM according to an embodiment of the present invention.

Referring to FIGS. 3 and 4A to 4G, a DRAM according to a first embodiment will be described below. First, an arrangement of the first embodiment of the present invention will be described with reference to FIG. 3. FIG. 3 shows a necessary portion of an arrangement corresponding to one column of memory cells in a ½ Vcc precharging type CMOS DRAM. Precharge equalizer 21 is connected to ends of bit lines BL and $\overline{BL}$ and precharges the bit lines to ½ Vcc to read out data from cell C1 or C2. Barrier transistors T1 and T2 each constituted by, e.g., an n-channel MOS transistor are connected in series with the other ends of bit lines BL and $\overline{BL}$, respectively. Operations of barrier transistors T1 and T2 are controlled by control signal $\phi$T from controller 15.

Restore circuit 11 and sense amplifier 12 are connected between, bit line portions $\alpha$ and $\overline{\alpha}$ at the side opposite the memory cells with reference to barrier transistors T1 and T2. Circuit 11 includes a flip-flop circuit obtained by connecting two p-channel transistors P1 and P2, and its ON and OFF states are controlled by restore control signal RS from controller 15. Amplifier 12 includes a flip-flop circuit obtained by connecting two n-channel transistors N1 and N2, and its ON and OFF states are controlled through n-channel transistor N3 which is turned on/off by sense amplifier control signal $\phi$1 from controller 15.

Transfer gates 13 and 14 are connected in series with the other ends of bit line portions $\alpha$ and $\overline{\alpha}$ and are turned on/off by column selection signal CSL from controller 16. Data on bit line portions $\alpha$ and $\overline{\alpha}$ are supplied to data lines DL and $\overline{DL}$ through transfer gates 13 and 14, respectively. In accordance with an input read control signal $\overline{RAS}$, controller 15 generates control signals $\phi$1, $\phi$T, and RS respectively for controlling precharging, restoring, and sensing operations of the bit lines.

A read operation of the DRAM according to the first embodiment of the present invention will be described below with reference to FIGS. 4A to 4G.

Figure 4:
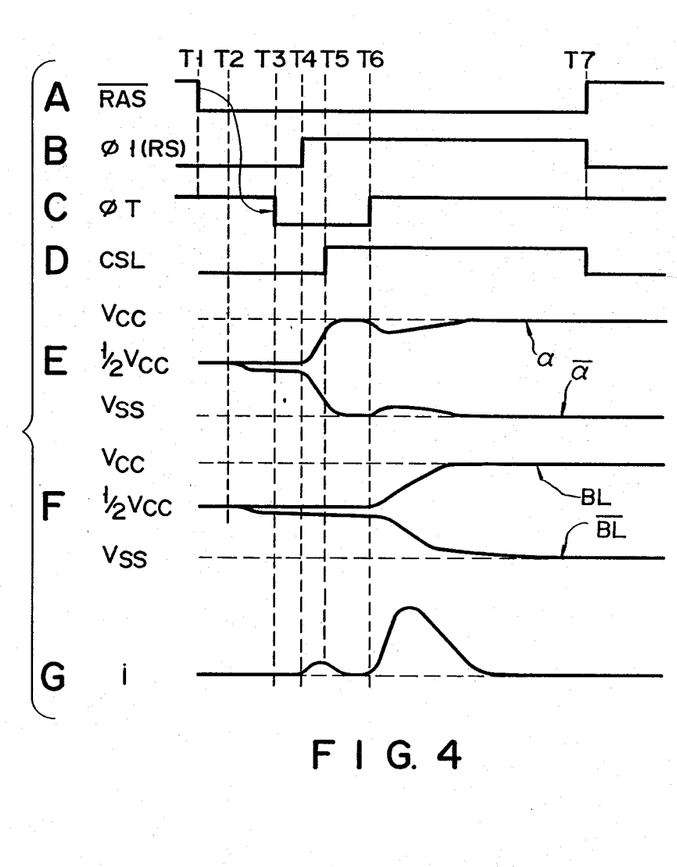
FIGS. 4A to 4G are timing charts for explaining a sensing operation of the DRAM of FIG. 3.

A period until signal $\overline{RAS}$ is input at timing T1 is for a precharge operation of bit lines. Bit lines BL and $\overline{BL}$ are supplied with ½ Vcc by equalizer 21. Signal $\phi$T for transistors T1 and T2 is set to a potential higher than ½ Vcc+VT by controller 15 for the precharge operation. Therefore, barrier transistors T1 and T2 are turned on, and bit lines BL and $\overline{BL}$ and bit lines $\alpha$ and $\overline{\alpha}$ are precharged by equalizer 21 to ½ Vcc. Equalizer 21 becomes inactive when signal $\overline{RAS}$ is input and the precharge operation of the bit lines is completed.

Then, when word lines W and $\overline{W}$ connected to memory cells C1 and C2 are selected at timing T2, transistors CT1 and CT2 are turned on. Therefore, a small potential difference is generated between bit lines BL and $\overline{BL}$ due to memory cell data as shown in FIG. 4F. This potential difference between bit lines BL and $\overline{BL}$ is small at first but is gradually increased as time passes. In this case, assuming that cell C2 is a dummy cell and data "1" is stored in cell C1, the potential of bit line BL becomes higher than that of bit line $\overline{BL}$.

At this time, since barrier transistors T1 and T2 have been turned on, voltages are generated on bit lines BL and $\overline{BL}$ in accordance with the memory cell data, i.e., memory cell voltages are transferred to bit line portions $\alpha$ and $\overline{\alpha}$ through barrier transistors T1 and T2, respectively, as shown in FIG. 4E. When the potential difference is so increased as to be detected by amplifier 12, signal $\phi$T is switched to a low potential at timing T3 as shown in FIG. 4C. Therefore, barrier transistors T1 and T2 are substantially turned off.

As shown in FIG. 4B, signals $\phi$1 and RS are output from controller 15 to circuit 11 and amplifier 12, respectively, at timing T4. However, it is not necessary that these signals need to be output at the same time. In this case, the potential of bit line BL is higher than that of bit line $\overline{BL}$. Therefore, when signal RS is input, transistor P1 is turned on, and transistor P2 is turned off. In amplifier 12, transistors N2 and N3 are turned on, and transistor N1 is kept off. Since the load capacitances of bit line portions $\alpha$ and $\overline{\alpha}$ are very small, the potential difference between bit line portions $\alpha$ and $\overline{\alpha}$ is rapidly increased as shown in FIG. 4E and hence can be sensed by amplifier 12 earlier than in a conventional DRAM. At this time, a discharging current flows as shown in FIG. 4G.

When data of the memory cell is sensed by amplifier 12, controller 16 outputs signal CSL to transfer gates 13 and 14 at timing T5. Therefore, transfer gates 13 and 14 are turned on, and data between bit line portions $\alpha$ and $\overline{\alpha}$ are read out to data lines DL and $\overline{DL}$.

Then, as shown in FIG. 4C, signal $\phi$T is switched to a high potential again at timing T6, and barrier transistors T1 and T2 are turned on. For this reason, although the potential difference between bit line portions $\alpha$ and $\overline{\alpha}$ slightly varies as shown in FIG. 4E, it is restored by circuit 11 and amplifier 12. At this time, a large discharging current flows as shown in FIG. 4G. Bit lines BL and $\overline{BL}$ are sensed/restored by amplifier 12 and circuit 11. Therefore, as shown in FIG. 4F, the potential difference between bit lines BL and $\overline{BL}$ is rapidly increased. As a result, bit line BL goes to potential Vcc, and bit line $\overline{BL}$ goes to potential Vss.

Thereafter, when signal $\overline{RAS}$ is inactivated at timing T7, signals $\phi$1 and CSL are reset, and the data reading, sensing, and restoring operations are completed. Signal CSL is controlled in accordance with signals $\overline{\text{RAS}}$ and $\overline{\text{CAS}}$.

As described above, during the reading operation, bit line portions $\alpha$ and $\overline{\alpha}$ are sensed/restored when barrier transistors T1 and T2 are temporarily turned off, and bit lines BL and $\overline{\text{BL}}$ are sensed/restored when barrier transistors T1 and T2 are turned on again. Since the load capacitances of bit line portions $\alpha$ and $\overline{\alpha}$ are smaller than those obtained when bit lines BL and $\overline{\text{BL}}$ are connected to bit line portions $\alpha$ and $\overline{\alpha}$, respectively, data can be sensed at speed higher than that of a conventional DRAM. In addition, since bit lines BL and $\overline{\text{BL}}$ are sensed/restored after bit line portions $\alpha$ and $\overline{\alpha}$ are sensed/restored, bit line charging/discharging current i becomes smaller than that in a conventional DRAM wherein entire bit lines BL and $\overline{\text{BL}}$ are sensed/restored at the same time during data reading. Therefore, a noise signal is rarely generated in the memory power source voltage.

In the first embodiment, barrier transistors T1 and T2 are substantially turned off for a period from timing T3 to timing T6. However, even if barrier transistors T1 and T2 are not completely turned off but only set at impedances higher than those in ON states, data can be sensed at speed higher than that in a conventional DRAM. More specifically, if bit lines $\alpha$ and $\overline{\alpha}$ are sensed when transistors T1 and T2 are in the higher impedance states, bit lines BL and $\overline{\text{BL}}$ can be also sensed. However, the sensing/restoring operation for bit lines BL and $\overline{\text{BL}}$ is very slowly performed compared to that for bit lines $\alpha$ and $\overline{\alpha}$. This is because charge/discharge current flowing between bit lines BL and $\alpha$ or between bit lines $\overline{\text{BL}}$ and $\overline{\alpha}$ when transistors T1 and T2 are in the higher impedance states is less than that when transistors T1 and T2 are in the ON state. Therefore, the sensing/restoring operation for bit lines $\alpha$ and $\overline{\alpha}$ can be performed at high speed regardless of that for bit lines BL and $\overline{\text{BL}}$.

Also, in the first embodiment, sense amplifier 12 and restore circuit 11 may initiate the sensing/restoring operation at timing T4 earlier than timing T3 when transistors T1 and T2 are turned off or at the same timing as timing T3. In this case, as shown in FIGS. 7A to 7H, bit lines $\alpha$ and $\overline{\alpha}$ can be sensed and restored speedily if barrier transistors T1 and T2 are turned off while bit lines BL and $\overline{\text{BL}}$ and bit lines $\alpha$ and $\overline{\alpha}$ are sensed and restored even though sense amplifier 12 and restore circuit 11 initiate the sensing/restoring operations at timing ③.

A second embodiment of the present invention will be described below with reference to FIGS. 5 and 6A to 6G.

Figure 5:
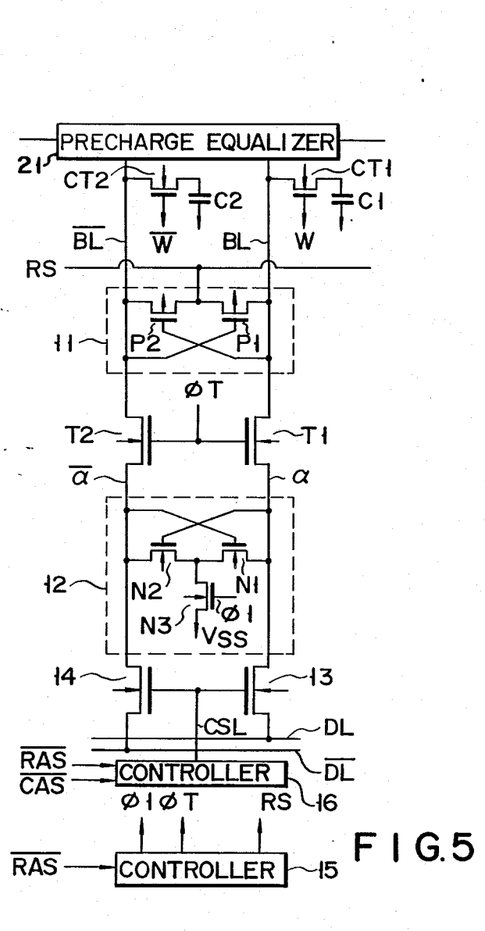
FIG. 5 is a circuit diagram showing part of an arrangement of a DRAM according to another embodiment of the present invention.

First, referring to FIG. 5, an arrangement of the second embodiment will be described. In FIG. 5, the same parts as in FIG. 3 will be denoted by the same reference numerals. In FIG. 5, restore circuit 11 is connected between bit lines BL and $\overline{\text{BL}}$. Similar to the first embodiment shown in FIG. 3, in accordance with input read control signal $\overline{\text{RAS}}$, controller 15 outputs control signals $\phi 1$, RS, and $\phi T$ to sense amplifier 12, circuit 11, and barrier transistors T1 and T2, respectively.

Figure 6:
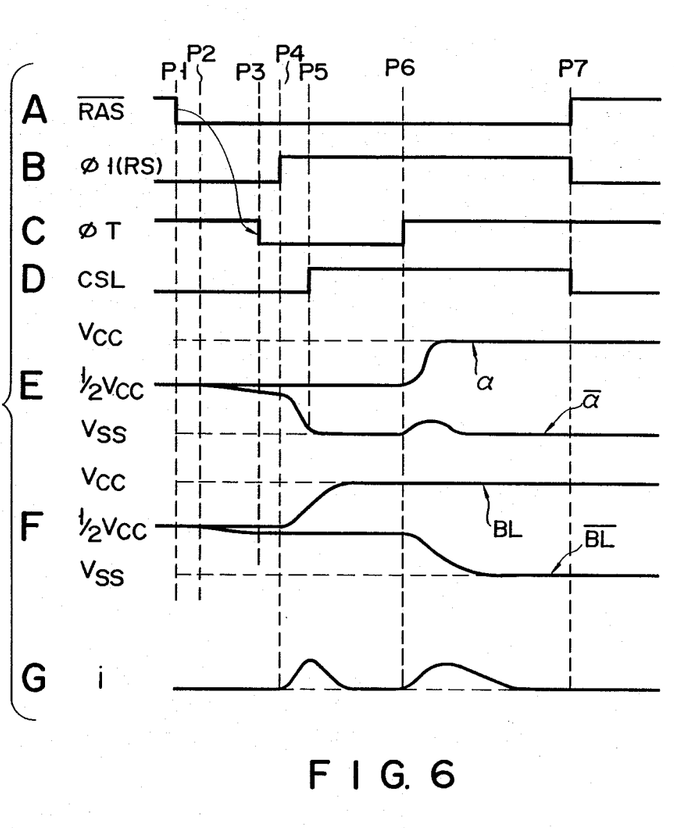
FIGS. 6A to 6G are timing charts for explaining a sensing operation of the DRAM of FIG. 5.
Figure 7:
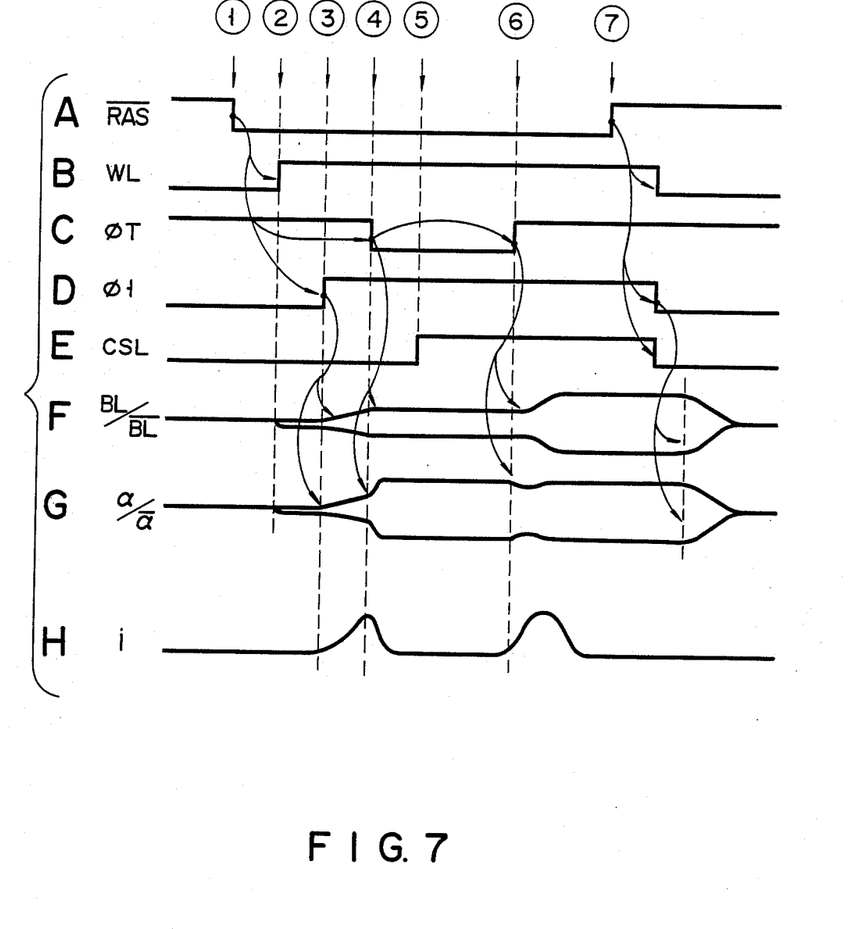
FIGS. 7A to 7H are additional timing charts for explaining a sensing operation of the DRAM of FIG. 3.
Figure 8:
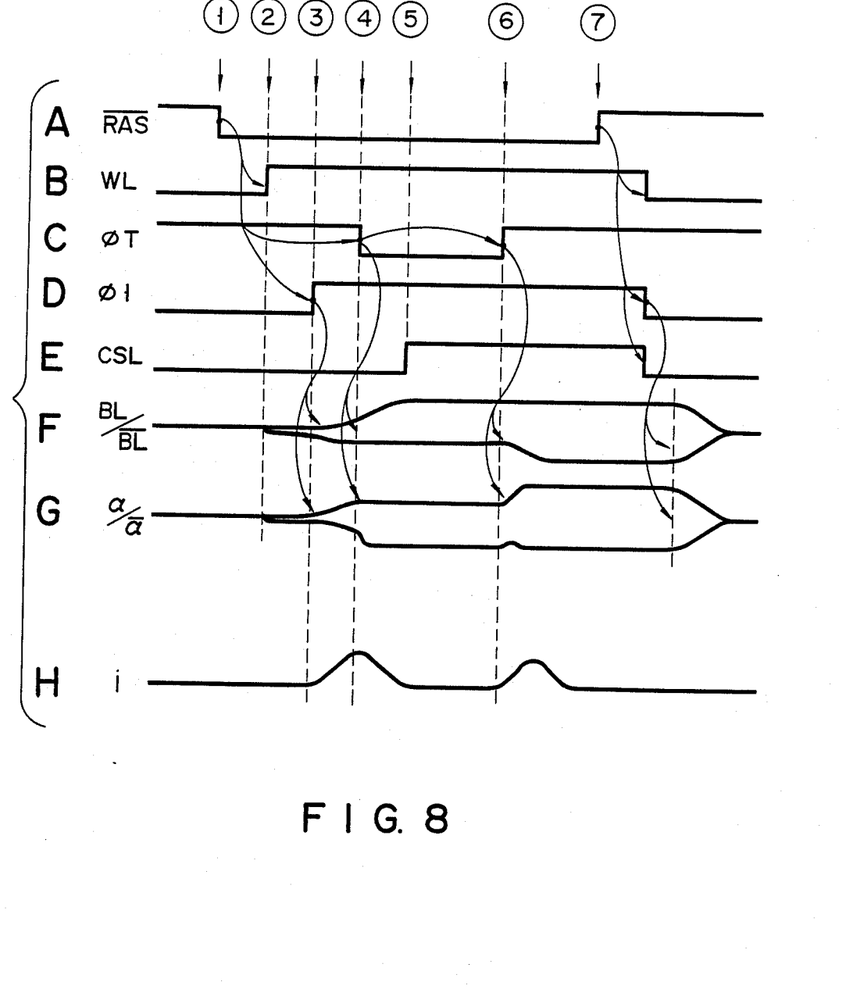
FIGS. 8A to 8H are additional timing charts for explaining a sensing operation of the DRAM of FIG. 5.

An operation of the second embodiment will be described below with reference to FIGS. 6A to 6G. When signal $\overline{\text{RAS}}$ is input, precharge equalizer 21 becomes inactive, and a precharge operation for bit lines BL and $\overline{\text{BL}}$ and bit lines $\alpha$ and $\overline{\alpha}$ is completed. A word line is designated at timing P2, and transistors CT1 and CT2 are turned on. Therefore, as shown in FIG. 6F, a small potential difference is generated between bit lines BL and $\overline{\text{BL}}$ and bit line portions $\alpha$ and $\overline{\alpha}$. The generated potential difference is increased as time passes and transmitted to amplifier 12.

When a potential difference large enough to be detected by amplifier 12 is transmitted between bit line portions $\alpha$ and $\overline{\alpha}$, signal $\phi T$ is switched to level L at timing P3 as shown in FIG. 6C, thereby separating bit lines BL and $\overline{\text{BL}}$ from bit line portions $\alpha$ and $\overline{\alpha}$. Thereafter, at timing P4, controller 15 outputs signals $\phi 1$ and RS to amplifier 12 and circuit 11. Therefore, the potential difference between bit line portions $\alpha$ and $\overline{\alpha}$ or bit lines BL and $\overline{\text{BL}}$ is increased. In this case, a potential difference of bit lines BL and $\overline{\text{BL}}$ having large load capacitances is slowly determined by only circuit 11, and that of bit line portions $\alpha$ and $\alpha$ having small load capacitances is determined faster. However, in either case, the potential is determined by only circuit 11 or amplifier 12. Therefore, only a potential difference up to about $\frac{1}{2}$ Vcc is generated. In order to read out data when this potential difference may be generated, data lines DL and $\overline{\text{DL}}$, for example, are precharged to Vcc potential. In this case, by turning on transfer gates 13 and 14, the data can be sufficiently read out.

Then, when barrier transistors T1 and T2 are turned on again at timing P6, the restoring operation is performed by amplifier 12 and circuit 11 until the potential difference between bit line portions $\alpha$ and $\overline{\alpha}$ and that between bit lines BL and $\overline{\text{BL}}$ become Vcc, respectively, as shown in FIGS. 6E and 6F. In this case, FIG. 6E shows a case wherein the potential difference of Vcc is generated also between bit line portions $\alpha$ and $\overline{\alpha}$ by completely turning on barrier transistors T1 and T2 under the condition of $\phi T \geq \text{Vcc} + V$. However, if the potential difference of Vcc is required between only bit lines BL and $\overline{\text{BL}}$, the condition of $\phi T \geq VT$ is sufficient.

According to the second embodiment, during the sensing operation, the potential difference of bit lines BL and $\overline{\text{BL}}$ having large load capacitances is determined twice, i.e., in a time interval between timings P3 and P6 wherein barrier transistors T1 and T2 are turned off and in a time interval between timings P6 and P7 wherein barrier transistors T1 and T2 are turned on. Therefore, the bit line charging/discharging current can be divided into two parts, thereby further reducing its peak current as compared with that in the first embodiment.

Note that in the circuit shown in FIG. 5, if circuit 11 and amplifier 12 are replaced with each other, the same effect as that described above can be obtained.

Also, in the second embodiment, similarly to the first embodiment, barrier transistors T1 and T2 can be used not in off state but in a higher impedance state and the sensing/restoring operation may be initiated before transistors T1 and T2 are turned off, as being shown in FIGS. 8A to 8H. Thus, the sensing/restoring operation can be performed at a higher speed.

Further the present invention is not limited to the above embodiments. For example, the sense amplifier may be constituted by p-channel transistors, and p-channel transistors may be used as the barrier transistors so that the Vss potential is supplied to their gates. In addition, the restore circuit can perform the restoring operation regardless of whether p- or n-channel transistors are used and hence can be applied to any of NMOS, PMOS, and CMOS memories.

What is claimed is: pg,17

1. A dynamic semiconductor memory apparatus for reading data at a high speed, comprising:

memory cells for storing data;

first and second bit line pairs operatively connected such that a voltage difference corresponding to data read out from one of said memory cells is transferred from said first bit line pair to said second bit line pair;

switching means connected between said first and second bit line pairs for selectively disconnecting said second bit line pair from said first bit line pair in accordance with an input first control signal;

first driving means coupled to said second bit line pair and being responsive to an unput second control signal for driving one line of said second bit line pair to a first potential in accordance with said voltage difference and driving one line of said first bit line pair coupled to said one line of said second bit line pair to said first potential in accordance with said voltage difference when said switching means disconnects said second bit line pair from said first bit line pair;

transfer gate means coupled between said second bit line pair and data line pair and being responsive to an input third control signal for transferring data on said second bit line pair to said data line pair, and control means responsive to an input read instruction for generating said first control signal when said voltage difference transferred to said first driving means is more than a first predetermined value, for generating said second and third control signals and for outputting said first control signal to said switching means, said second control signal to said first driving means and said third control signal to said transfer gate means.

2. An apparatus according to claim 1, wherein said control means generates said third control signal when said voltage difference on said second bit line pair is more than a second predetermined value.

3. An apparatus according to claim 1, and further comprising second driving means coupled to said second bit line pair and responsive to a fourth control signal for driving the other line of said second bit line pair to a second potential in accordance with said voltage difference and for driving the other line of said first bit line pair coupled to the other line of said second bit line pair to said second potential in accordance with sadi voltage difference when said switching means disconects said second bit line pair from said first bit line pair, wherein said control means generates said fourth control signal.

4. An apparatus according to claim 3, wherein said control means generates said fourth control signal while said first control signal is generated.

5. an apparatus according to claim 1, futher comprising second driving means coupled to said first bit line pair and responsive to a fourth control signal for driving the other line of said first bit line pair to a second potential in accordance with said voltage difference and for driving the other line of said second bit line pair coupled to the other line of said first bit line to said second potential in accordance with said second bit line pair from said first bit line pair, wherein said control means generates said fourth control signal.

6. An apparatus according to claim 5, wherein said control means generates said fourth control signal while said first control signal is generated.

7. A dynamic semiconductor memory apparatus for reading data at a high speed, comprising:

memory cells for storing data;

first and second bit line pairs operatively connected such that a voltage difference corresponding to data read out from one of said memory cells is transferred from said first bit line pair to said second bit line pair;

switching means connected between said first and second bit line pairs for selectively disconnectinq said second bit line pair from said first bit line pair in accordance with an input first control signal;

first driving means coupled to said second bit line pair and being responsive to an input second control signal for driving one line of said second bit line pair to a first potential in accordance with said voltage difference and driving one line of said first bit line pair coupled to said one line of said second bit line pair to said first potential in accordance with said voltage difference when said switch means disconnects said bit line pair from said first bit line pair;

transfer gate means coupled between said second bit line pair and a data line pair and being responsive to an input third control signal for transferring data on said second bit line pair to said data line pair, and control means responsive to an input read instruction for generating said second control signal when said voltage difference transferred to said first driving means is more than a first predetermined value, for generating said first and third control signals and for outputting said first control signal to said switching means, said second control signal to said first driving means and said third control signal to said transfer gate means.

8. An apparatus according to claim 7, wherein said control means generates said third control signal when the voltage difference on said second bit line pair is more than a second predetermined value.

9. An apparatus according to claim 7, further comprising second driving means coupled to said second bit line pair and responsive to a fourth control signal for driving the other line of said second bit line pair to a second potential in accordance with said voltage difference and for driving the other line of said first bit line pair coupled to the other line of said second bit line pair to said second potential in accordance with said transferred voltage difference when said switching means disconnects said second bit line pair from said first bit line pair, wherein said control means generates said fourth control signal.

10. An apparatus according to claim 9, wherein said control means generates said fourth control signal while said first control signal is generated.

11. An apparatus according to claim 7, further comprising second driving means coupled to said first bit line pair and responsive to a fourth control signal for driving the other line of said first bit line pair to a second potential in accordance with said voltage difference and driving the other line of said second bit line pair coupled to the other line of said first bit line pair to said second potential in accordance with said voltage difference when said switching means disconnects said second bit line pair from said first bit line pair, wherein said control means generates said fourth control signal.

12. An apparatus according to claim 11, wherein said control means generates said fourth control signal while said first control signal is generated.

13. A method for reading data at a high speed in a dynamic semiconductor memory apparatus comprising:
   transferring a voltage difference corresponding to data read out from a memory cell from a first bit line pair to a second bit line pair via a switch;
   selectively disconnecting said second bit line pair from said first bit line pair in accordance with a first control signal;
   sensing a voltage difference on said second bit line pair when said voltage difference on said second bit line pair is more than a first predetermined value, and driving one line of said second bit line pair to a first potential;
   driving one line of said first bit line pair coupled to said one line of said second bit line pair to said first potential after said one line of said second bit line pair is driven to said first potential and;
   transferring said voltage difference on said second bit line pair to a data line pair in response to a second control signal.

14. A method according to claim 13, further comprising the step of generating said first control signal before said voltage difference on said second bit line pair is sensed, when said voltage difference is more than said first predetermined value and is transferred to said second bit line pair.

15. A method according to claim 13, further comprising the step of generating said first control signal when said voltage difference on said second bit line pair is sensed such that said first bit line pair is not driven to said first potential.

16. A method according to claim 13, further comprising the step of drivng the other line of said second bit line pair to a second potential in accordance with said voltage difference, and driving the other line of said first bit line pair coupled to the other line of said second bit line pair to said second potential in accordance with said voltage difference when said second bit line pair is disconnected from said first bit line pair.

17. a method according to claim 13, further comprising the step of driving the other line of said first bit line pair to a second potential in accordance with said voltage difference, and driving the other line of said second bit line pair coupled to the other line of said first bit line pair to said second potential in accordance with said voltage difference when said second bit line pair is disconnected from said first bit line pair.

* * * * *